United States Patent [19]
Walter

[11] 4,058,415
[45] Nov. 15, 1977

[54] DIRECTIONALLY SOLIDIFIED COBALT-BASE EUTECTIC ALLOYS

[75] Inventor: John L. Walter, Scotia, N.Y.

[73] Assignee: General Electric Company, Schenectady, N.Y.

[21] Appl. No.: 627,067

[22] Filed: Oct. 30, 1975

[51] Int. Cl.² .................................... C22C 19/07
[52] U.S. Cl. ............................ 148/32; 75/170; 75/171
[58] Field of Search ............... 75/170, 171; 148/32, 148/32.5

[56] References Cited

U.S. PATENT DOCUMENTS

| 3,793,013 | 2/1974 | Walter et al. | 75/171 |
| 3,799,768 | 3/1974 | Tarshis et al. | 75/171 |
| 3,802,934 | 4/1974 | Augustine et al. | 75/171 |

Primary Examiner—R. Dean
Attorney, Agent, or Firm—F. Wesley Turner; Joseph T. Cohen; Jerome C. Squillaro

[57] ABSTRACT

A directionally solidified casting comprising improved high temperature properties is provided having a cobalt-base matrix and consisting essentially of, on a weight basis, 10-20% nickel, 8.1-25% tungsten, 0-10% chromium, 10-23% tantalum, 0.1-1.5% carbon, the balance being cobalt. Embedded in the matrix is an aligned tantalum carbide reinforcing fibrous phase.

12 Claims, 16 Drawing Figures

DIRECTIONALLY SOLIDIFIED COBALT-BASE EUTECTIC ALLOYS

The present invention relates to eutectic superalloy articles and compositions and more particularly to such articles and compositions which include a superalloy matrix reinforced with aligned carbide fibers.

The performance requirements for gas turbine engines such as those which power aircraft are constantly increasing with advanced designs. Hence, there is a continuing need for improved materials for gas turbine components which operate in high temperature environments. These materials are critical in affecting overall engine performance and can allow designers to increase power generated, operating temperatures, component life, or a combination of these factors.

The development of cobalt-base superalloys widely used for many years in the gas turbine engine art has reached a point at which advances are based not only on the superalloy itself, but also the orientation of phases of the superalloy or inclusions of reinforcing members such as fibers which can be formed in situ during the solidification of the alloy. One form of such solidification which has been used and widely reported is generally referred to as directional solidification. It was recognized that such directional solidification of eutectic alloys is a feasible method for producing metallic composites including aligned lamellae or fibers as a reinforcing phase dispersed in the matrix. In these directionally solidified eutectic alloy composites, the strength properties at high temperatures greater than 1,000° C. (1,832° F.) are provided by the fiber reinforcing phase. Thus, in order to improve the high temperature stress-rupture properties, it is desirable to increase both the fiber volume fraction and the number of fibers in the composite.

Heretofore, in Walter et al., U.S. Pat. No. 3,793,013, we disclosed the preparation of unidirectionally solidified cobalt-base carbide reinforced cast superalloy bodies having high strength and high stress-rupture properties particularly at elevated temperatures. The reinforcing fibers present in the matrix were aligned single crystal fibers of metal monocarbides. The range of compositions were a trace to 14.5% nickel, a trace to 26.0% chromium, a trace to 6.5% tungsten, 13.5 to 19% tantalum, 1.2 to 1.5% carbon, a trace to 1.0% iron, the balance being cobalt. A preferred casting described therein was TaC-Co50B having a composition of about 8.5% nickel, 6.0% tungsten, 15.0% chromium, 18.67% tantalum, 1.33% carbon, the balance being cobalt.

Although the cobalt-base eutectic alloys, defined in U.S. Pat. No. 3,793,013 have improved fiber density and thereby improved tensile and creep rupture strength, attempts heretofore to directionally solidify the improved alloys at solidification rates greater than ¼ inch/hour (inch/hr.) have not been successful since cell and dendrite formation occurs at solidification rates in excess of ¼ inch/hr.

Another improvement in the stability and high temperature properties of unidirectionally solidified anisotropic metallic composites is disclosed by R. W. Smashey, U.S. application Ser. No 366,047, filed June 1, 1973 (13DV6031) U.S. Pat. No. 3,904,402 and assigned to the assignee of the present invention, which discloses an article having a unidirectionally solidified, anisotropic metallic composite body which includes a solid solution matrix and an aligned carbide reinforcing fibrous phase embedded in the matrix. This matrix is a cobalt base superalloy and includes by weight at least about 2% rhenium to strengthen the matrix, along with less than 0.8% titanium to avoid generation of phases or compounds which would tend to degrade the carbide reinforcing fibrous phase. Smashey reported that the cobalt-base superalloys of his invention were not gamma prime strengthened and that their alloy strength depended solely on solution strengthening within the matrix. Particularly preferred cobalt-base superalloys of Smashey are described as compositions containing by weight from 10 to 16% chromium, 7 to 15% nickel, 1-6% tungsten, 10 to 15% tantalum, 0.7 to 1% carbon and 2-6% rhenium.

While both Walter et al. and Smashey were able to produce unidirectionally solidified cobalt-base superalloy composites having improved stress rupture properties, neither of the references is concerned with the effect of tungsten and chromium upon the solidification rate nor concerned with increasing the fiber density and the fiber volume fraction of the reinforcing phase in order to provide improved high temperature strength properties.

In accordance with the present invention, I have discovered a unidirectionally solidified anisotropic metallic casting having improved high temperature properties comprising a matrix of a cobalt-base superalloy including, on a weight basis, 10–20% nickel, 8.1–25% tungsten, 0–10% chromium, having an aligned reinforcing fibrous phase of tantalum monocarbide (TaC) embedded in the matrix. These castings have substantially increased fiber densities and fiber volume fractions over fiber reinforced cobalt-base superalloy castings known heretofore. In addition, I have found that these castings can be produced having a substantial improvement in stress-rupture properties at an elevated temperature.

In addition, I have found from the studies of the cobalt-base superalloys of my invention that cells and dendrites of TaC form during directional solidification when there is a significant range of temperatures over which the alloy freezes. In addition, I have found that as the chromium content of the alloy increases, the freezing range of the cobalt-base TaC superalloys increases. In addition, I have further found that increased quantities of tungsten do not cause increases in the freezing range of the cobalt-base TaC superalloy compositions. Further, in addition, I have found that by limiting the chromium content of the alloy and/or by substituting tungsten for chromium that the range of temperatures over which the alloy freezes is limited. Accordingly, I have found that by regulating the amount of chromium and/or tungsten contained in the alloys of my invention that I am able to cast unidirectionally solidified cobalt-base TaC superalloys containing nickel for a stabilization of hexagonal close packed (hcp) to face centered cubic (fcc) crystal transformation, chromium for oxidation resistance, and tungsten for solid solution strengthening at solidification rates greater than ¼ inch/hr. having improved high temperature stress-rupture properties.

The invention is more clearly understood from the following description taken in conjunction with the accompanying figures described hereafter.

Figure 5:
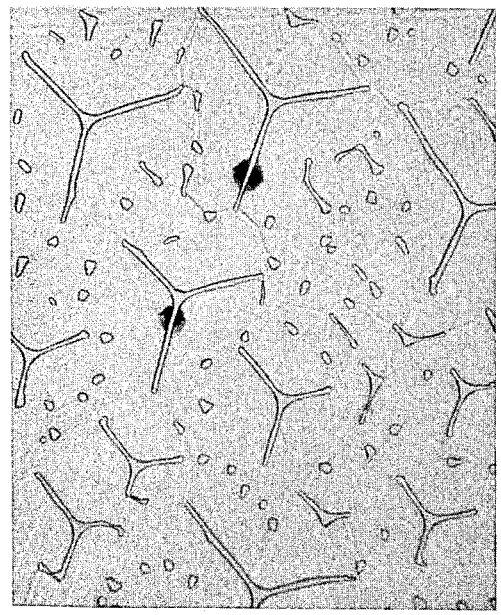
Figure 6:
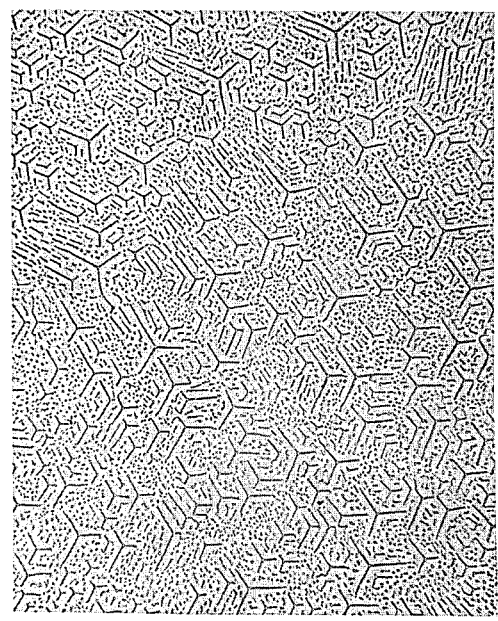
Figure 7:
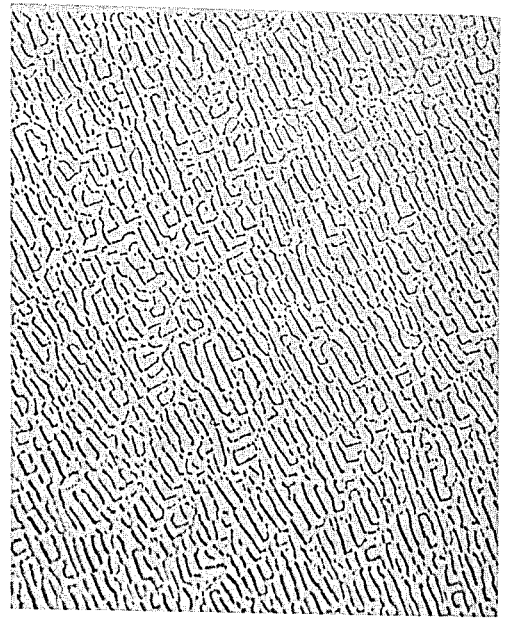
Figure 8:
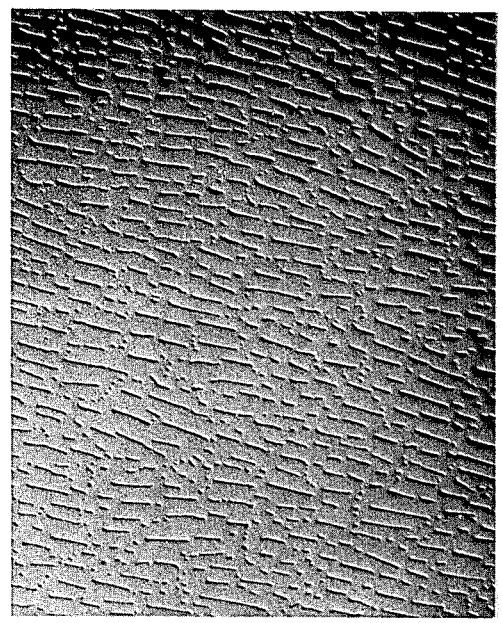
Figure 9:
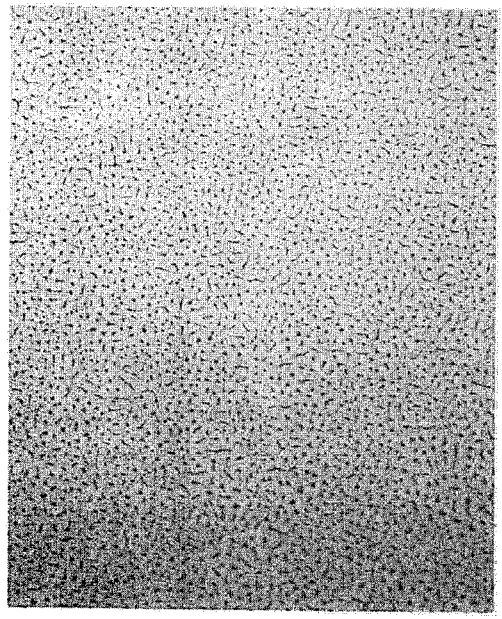
Figure 10:
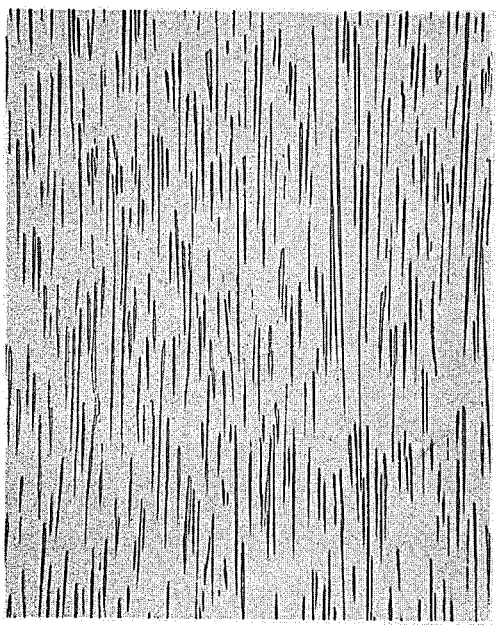
Figure 11:
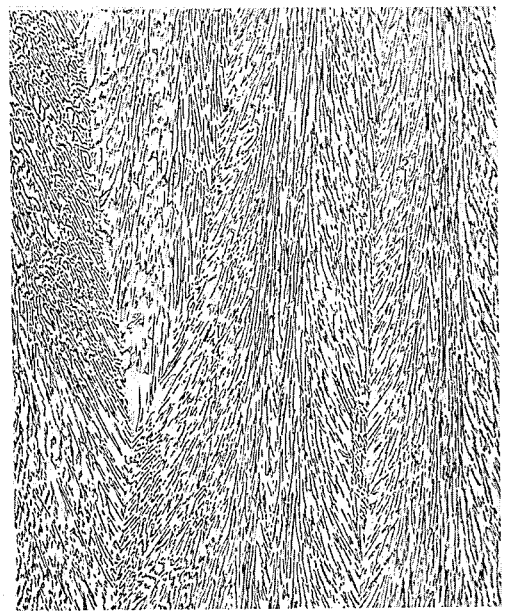
Figure 12:
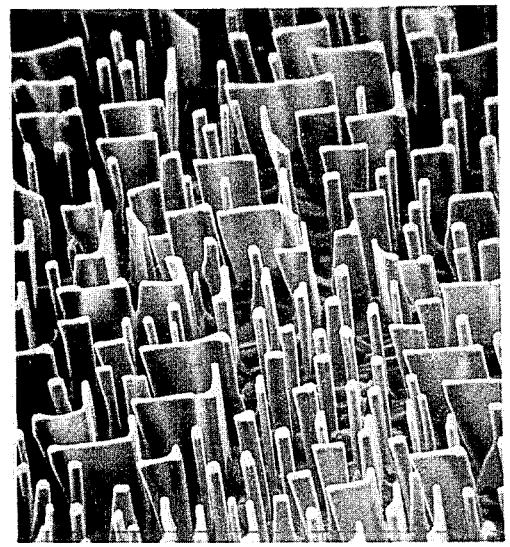
Figure 13:
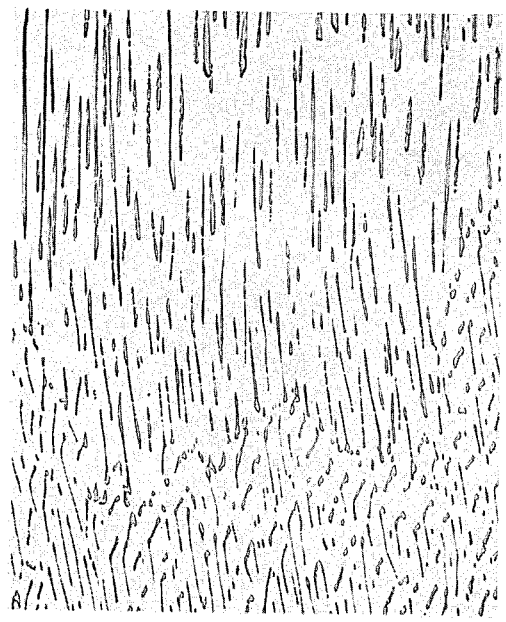
Figure 14:
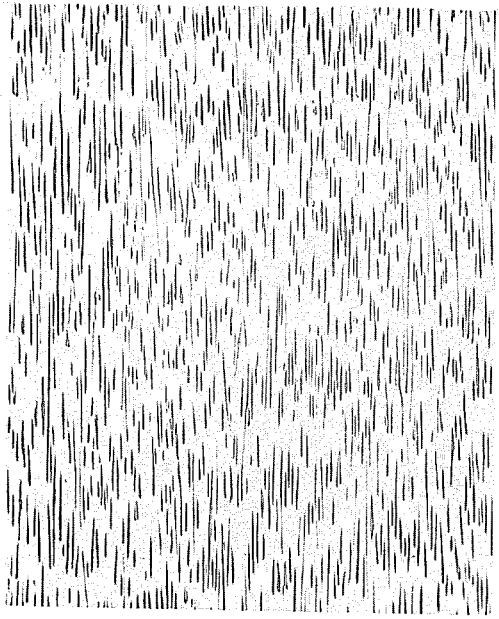
Figure 15:
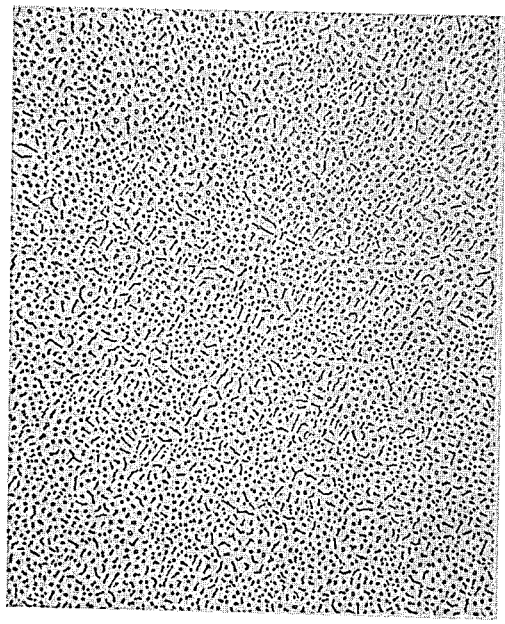
Figure 16:
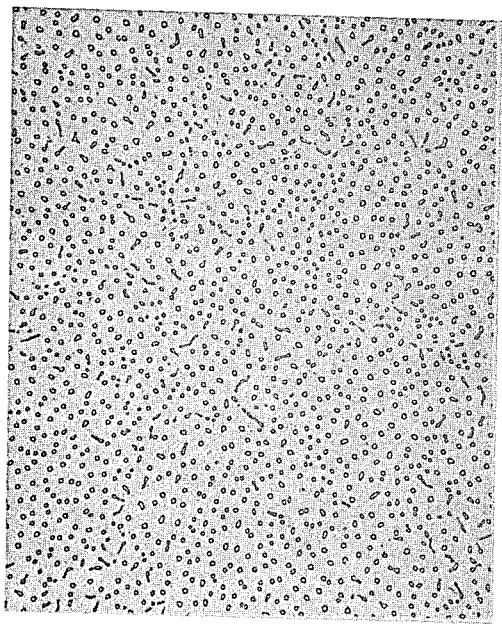

FIG. 5 is a photomicrograph of a transverse section illustrating the TaC phase of a simple eutectic cobalt 20-TaC tantalum carbide superalloy directionally solidified at ¼ inch/hr. (0.64 cm/hr.) containing from 1-2 mm. diameter columnar grains. The TaC phase appears as trifoils surrounded by whiskers in the composite region. Many of the trifoils are surrounded by a low angle boundary so that neighboring trifoils are rotated about their axes by as much as 5°-7° with respect to each other. The surrounding whiskers are, for the most part, located in the sub-boundaries. The crystallographic axes of the trifoils and whiskers in this composition is <111>. The cobalt matrix also has a <111> direction parallel to the axis of the columnar grains, i.e., parallel to the ingot axis. The addition of up to 20% nickel to the cobalt-TaC eutectic has no effect on the ingot structure or the TaC morphology illustrated by this figure;

FIG. 6 is a photomicrograph of a transverse section illustrating the TaC phase of a simple cobalt 20 wt.% tantalum carbide superalloy directionally solidified at 4 inches/hr. (10.2 cm./hr.). Increasing the solidification rate of the cobalt 20-TaC eutectic to 4 inches/hr. as illustrated has no significant effect on ingot structure except to reduce the size of both the trifoils and whiskers and to increase the number of whiskers relative to the number of trifoils. At still higher solidification rates, the foils become progessively more highly faulted, forming short blades from the longer foils. The blades, in turn, progressively become more faulted to become whiskers;

FIG. 7 is a photomicrograph of a transverse section of a cobalt 10-nickel 2-chromium 20-TaC superalloy directionally solidified at 2 inches/hr. (5.1 cm./hr.). This figure illustrates that at this solidification rate the morphology of the TaC fibers is retained in blade form, indicating that as the solidification rate of this alloy is increased from ¼ inch/hr. to 2 inches/hr. The TaC fiber's trifoil structure has progressively become more highly faulted and has formed short blades. At a solidification rate of 2.5 inches/hr. (6.4 cm./hr.), the blade morphology (not shown in any figure) largely persists of whisers. At a solidification rate of 3.5 inches/hr. (8.9 cm./hr), the TaC morphology (not shown in any figure) is a cell structure;

FIG. 8 is a photomicrograph of a transverse section of cobalt 10-nickel 3-chromium 20-TaC superalloy directionally solidified at ¼ inch/hr. The TaC fiber morphology is in the form of blades of <110> orientation in matrix grains of the same orientation. The TaC morphology of cobalt 10-nickel 2-chromium 20 -TaC persists in blade form up to about 1 inch/hr. (2.5 cm./hr.) and changes to whiskers and <100> fiber orientation at solidification rates of about 2 inches/hr;

FIG. 9 is a photomicrograph of a transverse section of a cobalt 10-nickel 3-chromium 20-TaC superalloy directionally solidified at 2 inches/hr. The morphology of the TaC fiber indicates that the transition from blades to whiskers is complete and dramatic at the solidifiction rate noted;

FIG. 10 is a photomicrograph of a longitudinal section of the alloy of FIG. 9 directionally solidified at 2 inches/hr.;

FIG. 11 is a scanning electron micrograph of a longitudinal section of the alloy of FIG. 9 directionally solidified at a rate 3 inches/hr. The morphology of the TaC fiber if completely cellular;

FIG. 12 is a scanning electron micrograph of a transverse section with the matrix removed of a cobalt 10-nickel 4-chromium 20-TaC superalloy directionally solidified at ¼ inch/hr. The TaC morphology consists of a mixture of blades and fibers;

FIG. 13 is a photomicrograph of a longitudinal section of the alloy of FIG. 12, a cobalt 10-nickel 4chromium 20-TaC superalloy directionally solidified at ¼ inch/hr. This figure shows the two morphologies coexisting or changing from one to the other with the whisker morphology occurring most often within the upper part of the composite region during directional solidification;

FIGS. 14 and 15 are photomicrographs of longitudinal and transverse sections, respectively, of the alloy of FIGS. 12 and 13, respectively, directionally solidified at a rate of 1 inches/hr. which illustrates that at this solidification rate the transition to whiskers and <100> fiber orientation is complete; and FIG. 16 is a photomicrograph of a transverse section of cobalt 10-nickel 5-chromium 20-TaC superalloy directionally solidified at ¼ inch/hr. illustrating that except for the spacing of the fibers, the structures of the alloy are the same as in FIG. 15 and that the transition from blades to fibers and from <110> fiber orientation to <100> fiber orientation is complete at 5% chromium content and ¼ inch/hr. solidification rate. The structure of this composition remains the same until a solidification rate of about 12 inches/hr. occurs wherein the ingot becomes cellular.

Figure 1:
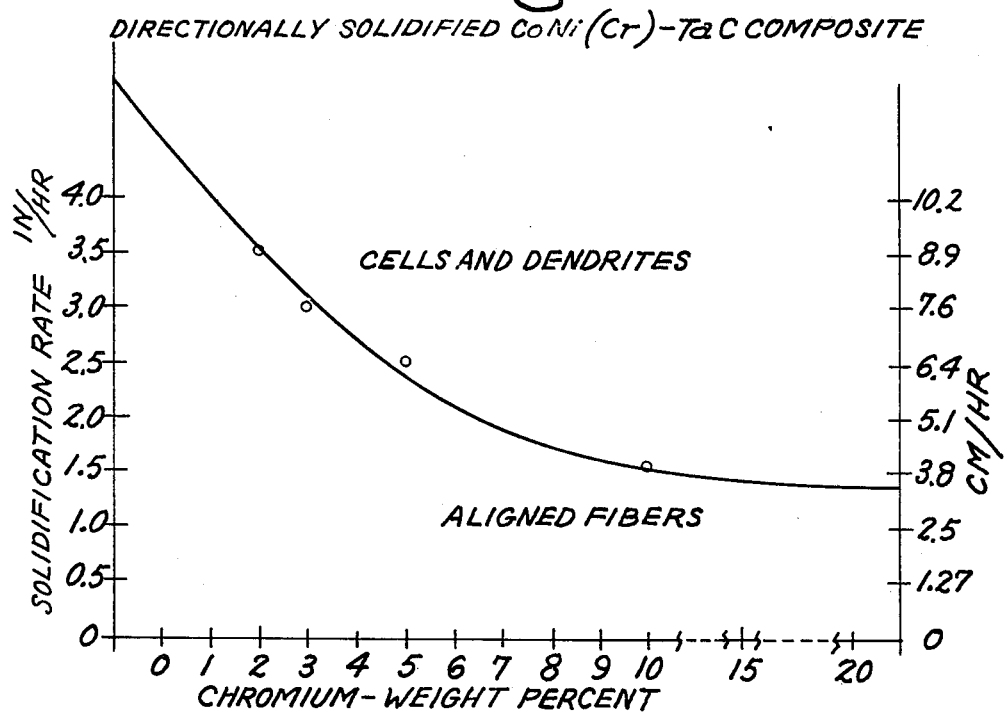
FIG. 1 is a drawing which illustrates the correlation between the solidification rate of a directionally solidified cobalt-base 10-nickel (chromium) 20-tantalum carbide composite as a function, on a weight basis, of the chromium content of the alloy.
Figure 2:
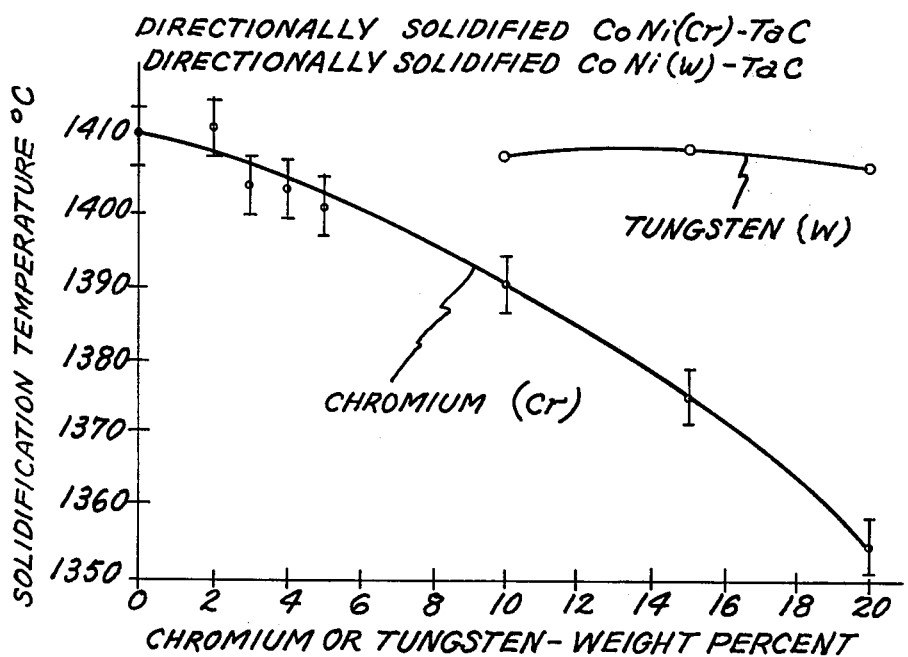
FIG. 2 is a drawing which illustrates the correlation between the tungsten or chromium content of cobalt-base 10-nickel 20-TaC, tungsten or chromium superalloys with the solidification temperature of the alloys.
Figure 3:
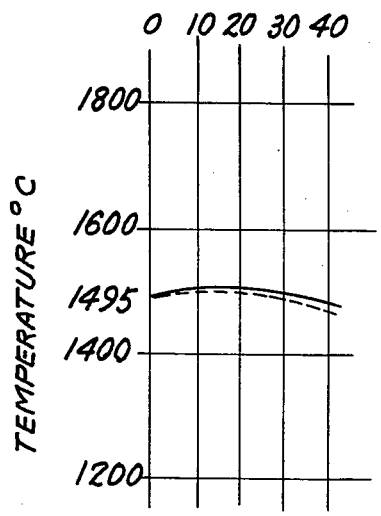
FIG. 3 is a drawing which illustrates portions of a binary phase diagram for a tungsten-cobalt system, which illustrates that as tungsten increases, the alloy melting temperature modestly decreases or remains substantially the same.
Figure 4:
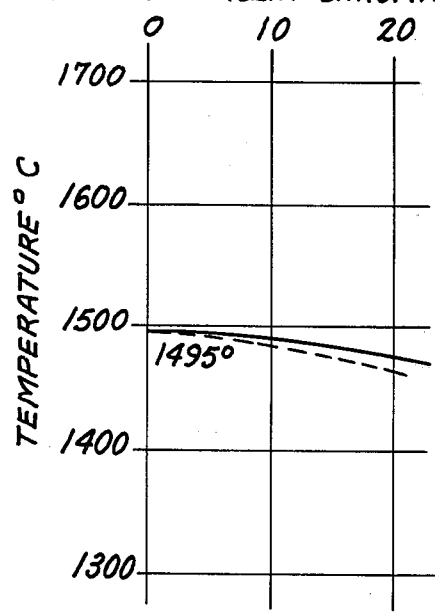
FIG. 4 is a drawing which illustrates portions of a binary phase diagram for a chromium-cobalt system, which illustrates that as the chromium content increases, the melting temperature substantially decreases.

From the examination of the FIGS. 1 to 16, it is apparent that the transition from blade to whiskers morphology of cobalt-base 10-nickel chromium 20-TaC alloys occurs with increasing chromium content as well as with increasing solidification rate. Further, addition of chromium in excess of 5% up to 20% by weight affects only the solidification rate at which cell formation occurs. From the graph of FIG. 1, it is seen that at 10% alloy chromium content cells form at a solidification rate of about 1½ inches/hr. while at 15 and 20% alloy chromium content cells (note FIG.. 11) form at solidification rates of about ½ inch/hr. and ¼ inch/hr., respectively.

Over the range of 2-15% chromium by weight, the maximum solidification rate for a cobalt 10-nickel (2-15%) chromium 20-TaC alloy which produces the desired two phase aligned composite structure varies within the range of from about 3½ inches/hr. to less than about ¼ inch/hr.

As mentioned previously, the composite structures formed by directional solidification of the eutectic alloys of my invention consist of a cobalt-base matrix phase with an aligned monocarbide fiber reinforcing phase embedded in the matrix. In general, the matrix phase provides low strength properties to the alloy below about 1,700° F., and the tantalum monocarbide reinforcing phase imparts high strength properties to the alloy at temperatures above of about 1,700° F. These high temperature strength properties may be most sensitively measured by stress-rupture tests well-known in the art. Time-temperature parameters have been devised to assist in correlating and extrapolating stress-rupture data. One particularly useful stress-rupture parameter is the Larson-Miller parameter given by the equation $$P = T(C + \log t) \times 10^{-3}$$

wherein T is temperature in degrees Rankine, C is equal to 20, and t is rupture time in hours, described in more detail in American Society of Engineers Transactions, 1952, Valence 74, at pages 765-771. A plot of this parameter as a function of applied stress is a satisfactory way to report stress-rupture data. Another way of showing or illustrating the high temperature strength properties is in terms of time to rupture as a function of the temperature and the applied stress.

In theory, which is not to be construed as limiting my invention thereto, primarily, my invention involves four basic factors.

The first is that as the density — defined herein and in the appended claims as the number of fibers per cm² of composites — of the alloy TaC fiber increases the high temperature stress-rupture properties of the alloy increases.

The second is that as the volume fraction — defined herein and in the appended claims as the volume occupied by the fibers as compared to the total volume of composite — of the alloy TaC fiber increases, the high temperature stress-rupture properties of the alloy increases.

The third is that the solidification rate and the resultant morphology of the alloy is effected by the chromium content of the alloy. In the casting process of this invention there is a maximum rate ($R_{max}$) of fiber formation — the maximum rate being defined herein and in the appended claims as the maximum solidification rate at which the eutectic alloy may be solidified without formation of undesirable cell or dendrite structure — which is relates to the amount of chromium contained by the alloy. In general, as the chromium content of the alloy increases, the maximum rate ($R_{max}$) decreases at which the eutectic alloy may be solidified without formation of undesirable cell of dendrite structures.

The fourth is that the solidification rate and the resultant morphology of the alloy is effected by the tungsten content of the alloy. In general, as the tungsten content of the alloy increases, the maximum rate ($R_{max}$) remains substantially unchanged (when contrasted with chromium) at which the eutectic alloy may be solidified without formation of undesirable cell or dendrite structures.

In general, the rate ($R_{max}$) is a function of the alloy composition for a fixed thermal gradient. The solidification temperature gradient generally falls within the range of from about 80° C. to about 150° C.

All of the foregoing factors are interrelated and affect the cobalt-base superalloys of this invention since an increase in the fiber density and/or an increase in the fiber volume fraction is effected by the solidification rate of the alloy, which solidification rate is interrelated to the chromium and/or tungsten content of the alloy.

As states hereinbefore, as the alloy chromium content decreases and as the alloy tungsten content increases, the maximum rate ($R_{max}$) increases at which the eutectic alloy may be solidified without the formation of the undesirable cell or dendrite structures. Since fiber density is directly proportional to solidification rate, it follows that a decrease in the chromium content and an increase in the tungsten content will increase the fiber density.

During directional solidification of the eutectic alloys, the freezing range or mushy zone (Delta) between the solidus and liquidus isotherms depends upon the composition of the matrix alloy. The narrow freezing range of the alloys of my invention, e.g. from about 0° to about 5° C. for alloys containing tungsten in amounts of 8.1-25% and from about 0° to about 20° C. for alloys containing chromium in amounts of 0-10% permits very high solidification rates, i.e. in excess of from about ¼ inch/hr.. up to at least about 1½ inches/hr. and in excess of from about ¼ inch/hr. up to at least about ½ inch/hr., respectively, at very low temperature gradients during directional solidification, i.e. about 80° C. per cm. which optimizes fiber density and volume fraction of the TaC fibers while avoiding cell or monocarbide dendrite formation. Since low gradients are easy to obtain for shaped with thickest dimensions exceeding about ½inch, quite advantageously by the practice of my invention high solidification rates can be readily obtained by regulating the tungsten and chromium contents of the alloys, maintaining a narrow solidification freezing range thereby providing high fiber density, high fiber volume fraction, which accordingly results in optimum alloy strength. As stated hereinbefore, the cobalt-base casting of the present invention have a melt composition consisting essentially of, on weight basis, 10.0-20% nickel, 8.1-25% tungsten, and 0-10% chromium, 10-23% tantalum, 0.1 to 1.5% carbon, the balance being cobalt and incidental impurities.

The element nickel which is included in the alloy in amounts of 10-20% by weight contributes to the stabilization of hcp to fcc transformation. Preferably the alloys of my invention contain from about 10-15%, and more preferably about 10%-12% nickel.

Essential to the cobalt-base alloys of my invention is the presence of substantial amounts of tungsten, i.e. 8.1-25%, preferably 8.1-23.5%, and more preferably 10-20%, since tungsten functions as a solid solution strengthener and permits maximum solidification rates ($R_{max}$) which enhances the TaC fiber density and volume percent. This fact is evident from the data of Table I, Examples 4-10, set out hereafter.

TABLE I

| Examples | Alloy Designation | | | | Solidification Rate (″/hr.) | Average Fiber Density Fibers/cm.² | Volume Percent TaC Fiber | Stress-Rupture Life (hrs.) 1950° F. at 25,000 psi |
|---|---|---|---|---|---|---|---|---|
| 1 | Co | 10Ni | 5Cr | 20TaC | ¼ | n.d. | n.d. | 10.0 |
| 2 | " | " | 10Cr | " | ¼ | n.d. | n.d. | 19.3 |
| 3 | " | " | 15Cr | " | ¼ | 2.5 × 10⁶ | n.d. | 25.0 |
| 4 | " | " | 10W | " | ¼ | 4.8 × 10⁶ | 8.48 | 88.0 |
| 5 | " | " | 15W | " | ¼ | 4.9 × 10⁶ | 9.17 | 107.0 |
| 6 | " | " | 20W | " | ¼ | 12.5 × 10⁶ | n.d. | 174.0 |

TABLE I-continued

| Examples | Alloy Designation | | | | Solidification Rate (''/hr.) | Average Fiber Density Fibers/cm.$^2$ | Volume Percent TaC Fiber | Stress-Rupture Life (hrs.) 1950° F. at 25,000 psi |
|---|---|---|---|---|---|---|---|---|
| 7 | '' | '' | 10W | '' | 1 | 17.6 × 10$^6$ | 9.06 | 616.0 |
| 8 | '' | '' | 15W | '' | 1 | 19.4 × 10$^6$ | 9.33 | 1098.0 |
| 9 | '' | '' | 20W | '' | 1 | 26.1 × 10$^6$ | n.d. | 2511.0[1] |
| 10 | '' | '' | '' | '' | 1½ | 30.9 × 10$^6$ | 13.43 | n.d. |

[1]test terminated

The data of Table I, set out hereinbefore, clearly illustrates the value of alloying with tungsten and/or chromium to acquire a high solidification rate compared with alloying for solid solution strengthening. Accordingly, at a solidification rate of ¼ inch/hr. by tripling the chromium content of the alloy — as illustrated by Examples 1–3 of Table I — the stress-rupture life is increased 1½ times and by doubling the tungsten content of the alloy — as illustrated by Examples 4—6 of Table I — the stress-rupture life is doubled. The data also shows that by increasing the solidification rate four-fold (4 times), i.e. from ¼inch/hr. to 1 inch/hr. — as illustrated by Examples 4—9 — alloy stress-rupture life was increased by seven-fold (7X) in the case of alloys containing 10% tungsten (note Examples 4 and 7) by ten-fold (10X) in the case of alloys containing 15% tungsten (note Examples 5 and 8), and by at least fourteen-fold (14X) in the case of alloys containing 20% tungsten (note Examples 6and 9). Further, the data of Table I illustrates the desirability of solidifying at both high solidification and high rates and high tungsten content since at a solidification rate of 1 inches/hr. the stress-rupture life of the alloy containing 20% tungsten is at least four-fold (4X) that of the alloy containing 10% tungsten also solidified at 1 inch/hr. (note Examples 7 and 9).

The chromium content of the alloys of my invention is present for solid solution strengthening and oxidation resistance. Large amounts of chromium decrease the maximum rate at which directional solidification of the alloys of my invention can be carried out, which accordingly limits the high temperature strength of the cobalt-base alloys. Accordingly, the chromium content of the alloys of my invention is equal to or less than 10%, preferably less than 5%, and even more preferably from about 0.1 to 2% chromium. The relationship between solification rate and chromium content is graphically set out, as mentioned before, in FIG. 1.

The principal carbide former in the present invention is the element tantalum. It is included within the range of about 10 to 23% by weight and preferably in the range of 14–19% by weight. Amounts of Ta less than about 10% by weight are insufficient to provide the high fiber density and volume fraction of the present invention. However, greater than about 23% by weight, Ta in combination with carbon at levels higher than those prescribed herein, exceeds matrix solubility resulting in undesirable phases or carbide morphologies.

Required in the composition of the present invention is the element carbon which is needed to combine with Ta to produce the carbide fibers. Less than 0.1% by weight is insufficient to form the carbide fibers. Greater than about 1.5% by weight C produces free carbon because there are not enough desirable carbide formers in the composition to react with the carbon. However, any such free carbon will slag off or will collect in the sorting-out portion of the casting which is adjacent the chill and which is later removed from the cast article. The amount of carbon included in the composition of this invention is a function of the amount of Ta sufficient to form a monocarbide.

In order to provide the article of the present invention, the alloy having the above described careful balance of elements must be unidirectionally solidified to enable carbide eutectic fibers to form integrally witin and be bonded to the reinforced solid solution matrix. Such unidirectional solidification can be conducted in one or more of the many methods and using apparatus well known and widely reported in the art as described by C. T. Sims et al., *The Superalloys,* Wiley & Sons (1972).

During the evaluation of the present invention, a large number of alloy compositions were evaluated in addition to the alloys described in Table I hereinbefore. The following Tables II and III list the compositions and test results of some of the testing of such alloys. All percentages in this table and elsewhere in the specification are percents by weight unless otherwise stated. The alloy examples in Table II have been grouped to facilitate reference to the discussion set out hereinbefore and to the comparative data of other tables or figures of the drawing.

TABLE II

| | | | | | | Cobalt-Base - Carbide Alloy | | | |
|---|---|---|---|---|---|---|---|---|---|
| Example | Alloy Designation | | | | wt. % Cr | wt. % W | TaC Form | TaC Crystal Orientation | Alloy Solidification Rate |
| | | | | | | | | | in./hr. (cm./hr.) |
| 1 | Co | 10Ni | 2Cr | 20TaC | 2 | — | trifoil | <111> | ¼ (0.64) |
| 2 | '' | '' | '' | '' | '' | — | blade | | 1 (2.5) |
| 3 | '' | '' | '' | '' | '' | — | '' | <310> | 2 (5.1) |
| 4 | '' | '' | '' | '' | '' | — | blades and whiskers | | 2½ (6.4) |
| 5 | '' | '' | '' | '' | '' | — | dendrites | | 3½ (8.9) |
| 6 | '' | '' | 3Cr | '' | 3 | — | blades | <110> | ¼ (0.64) |
| 7 | '' | '' | '' | '' | '' | — | '' | | 1 (2.5) |
| 8 | '' | '' | '' | '' | '' | — | whiskers | <100> | 2 (5.1) |
| 9 | '' | '' | '' | '' | '' | — | dendrites | | 3 (7.6) |
| 10 | '' | '' | 4Cr | '' | 4 | — | blades and whiskers | | ¼ (0.64) |
| 11 | '' | '' | '' | '' | '' | — | whiskers | <100> | 1 (2.5) |
| 12 | '' | '' | 5Cr | '' | 5 | — | '' | <100> | ¼ (0.64) |
| 13 | '' | '' | '' | '' | '' | — | dendrites | | 2 (5.1) |
| 14 | '' | '' | 10Cr | '' | 10 | — | '' | | 1½ (3.8) |
| 15 | '' | '' | 15Cr | '' | 15 | — | '' | | 1.0 (2.5) |
| 16 | '' | '' | 20Cr | '' | 20 | — | '' | | 1 (2.5) |
| 17 | '' | '' | 10W | '' | — | 10 | whiskers | <100> | ¼ 1½ (0.64–3.8) |

TABLE II-continued

| Example | Alloy Designation | | | wt. % Cr | wt. % W | Cobalt-Base - Carbide Alloy TaC Form | TaC Crystal Orientation | Alloy Solidification Rate in./hr. | (cm./hr.) |
|---|---|---|---|---|---|---|---|---|---|
| 18 | " | " | 15W | " | — | 15 | " | " | " " | " " |
| 19 | " | " | 20W | " | — | 20 | " | " | " " | " " |

TABLE III

| Example | Alloy Designation | | | | | Cobalt-Base - Carbide Alloy Solidification (Rate/hr.) | Fiber Density (Fibers/cm.²) | 1000° C Tensile Strength (psi) | Stress Rupture Properties Temp. (° F.) | Stress (psi) | Life (hr.) |
|---|---|---|---|---|---|---|---|---|---|---|---|
| 1 | 60Co | 10Ni | 10Cr | — | 20TaC | ¼ | | 54,300 | 2,012 | 20,000 | 603 |
| 2 | " | " | " | — | " | ¼ | | 64,300 | 1,700 | 40,000 | 544 |
| 3 | 55Co | " | 5Cr | 10W | " | ¼ | 8.4 × 10⁶ | 61,200 | 1,950 | 25,000 | 1,395 |
| 4 | " | " | " | " | " | ¼ | 16.9 × 10⁶ | 66,740 | 1,700 | 40,000 | |
| 5 | 60Co | " | — | " | " | ¼ | 4.8 × 10⁶ | 63,400 | 1,700 | 40,000 | 7.0 |
| 6 | " | " | — | " | " | " | 17.6 × 10⁶ | 63,400 | 1,950 | 25,000 | 88.4 |
| 7 | " | " | — | " | " | 1 | 2.6 × 10⁶ | 80,600 | n.d. | n.d. | n.d. |
| 8 | 55Co | " | 15Cr | — | " | ¼ | 58,200 | n.d. | n.d. | n.d. | n.d. |

Although the above examples have illustrated various modifications and changes that can be made in carrying out my process, it will be apparent to those skilled in the art that other changes and modifications can be made in the particular embodiments of the invention described which are within the full intended scope of the invention as defined by the appended claims.

I claim:

1. An article of manufacture having improved high temperature properties, improved fiber volume fraction and improved fiber density comprising a unidirectionally solidified anisotropic metallic casting comprising
   a. a matrix of cobalt-base superalloy consisting essentially of, on a weight basis, 10–20% nickel, 8.1–25% tungsten and less than 10% chromium, 10–23% tantalum, 0.1–1.5% carbon and the balance being essentially cobalt; and
   b. an aligned eutectic predominantly tantalum monocarbide reinforcing fibrous phase embedded in the matrix.

2. An article of manufacture having improved high temperature properties, improved fiber volume fraction and improved fiber density comprising a unidirectionally solidified anisotropic metallic casting comprising
   a. a matrix of a cobalt-base superalloy consisting essentially of, on a weight basis, 10–20% nickel, 10–20% tungsten, and less than 10% chromium, 10–23% tantalum, 0.1–1.5% carbon and the balance being essentially cobalt; and
   b. an aligned eutectic predominantly tantalum monocarbide reinforcing fibrous phase embedded in the matrix.

3. An article of manufacture having improved high temperature properties, improved fiber volume fraction and improved fiber density comprising a unidirectionally solidified anisotropic metallic casting solidified at a rate greater than ¼ inch per hour comprising
   a. a matrix of a cobalt-base superalloy consisting essentially of, on a weight basis, 10–20% nickel, 8.1–25% tungsten and less than 10% chromium, 10–23% tantalum, 0.1–1.5% carbon and the balance being essentially cobalt; and
   b. an aligned eutectic predominantly tantalum monocarbide reinforcing fibrous phase embedded in the matrix.

4. The article of claim 3, wherein the fibrous phase is tantalum monocarbide.

5. The article of claim 2, wherein
   a. said superalloy consists essentially of, on a weight basis, 10–15% nickel, 10–20% tungsten, 0–5% chromium, 14–19% tantalum, 0.1–1.5% carbon and the balance being essentially cobalt; and
   b. an aligned eutectic predominantly tantalum monocarbide reinforcing fibrous phase embedded in the matrix.

6. The article of claim 3, wherein the fiber volume fraction of said casting is at least about 8.5%.

7. The article of claim 3, wherein the average fiber density of said casting is at least about 4.9 × 10⁶ fibers/cm.².

8. The article of claim 3, wherein said casting is characterized at a temperature of 1,950° F. by a stress-rupture lift at 25,000 psi of at least 100 hours.

9. The article of claim 3, wherein said casting is characterized at a temperature of 1,950° F. by a stress-rupture life at 25,000 psi of at least 1,000 hours.

10. The article of claim 3, wherein said casting is characterized at a temperature of 1,950° F. by a stress-rupture life at 25,000 psi of at least 2,500 hours.

11. A method of improving the high temperature properties, fiber volume fraction and fiber density of a unidirectionally solidified anisotropic metallic casting comprising directionally solidifying at the eutectic solidification temperature of the alloy, at a solidification rate greater than ¼ of an inch, an alloy matrix comprising a cobalt-base superalloy consisting essentially of, on a weight basis, 10–20% nickel, 8.1–25% tungsten, less than 10% chromium, 10–23% tantalum, 0.1–1.5% carbon and the balance being essentially cobalt, said alloy matrix having an aligned eutectic predominantly tantalum monocarbide reinforcing fibrous phase embedded therein.

12. A method of improving the high temperature properties, fiber volume fraction and fiber density of a unidirectionally solidified anisotropic metallic casting comprising directionally solidifying at the eutectic solidification temperature of the alloy, at a solidification rate greater than ¼ of an inch, an alloy matrix comprising a cobalt-base superalloy consisting essentially of, on a weight basis, 10–20% nickel, 10–20% tungsten, 0–5% chromium, 10–23% tantalum, 0.1–1.5% carbon and the balance being essentially cobalt, said alloy matrix having an aligned eutectic predominantly tantalum monocarbide reinforcing fibrous phase embedded therein.

* * * * *